(12) United States Patent
Pisek et al.

(10) Patent No.: US 6,275,835 B1
(45) Date of Patent: Aug. 14, 2001

(54) FINITE IMPULSE RESPONSE FILTER AND METHOD

(75) Inventors: Eran Pisek; Moshe Tarrab, both of Holon; Yossi Amon, Tel-Aviv, all of (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/251,216

(22) Filed: Feb. 16, 1999

(51) Int. Cl.$^7$ ...................................................... G06F 17/10
(52) U.S. Cl. ............................................. 708/300; 708/719
(58) Field of Search ..................................... 708/300, 301, 708/303, 319, 511, 514, 520, 607, 622

(56) References Cited

U.S. PATENT DOCUMENTS 5,179,530 * 1/1993 Genusov et al. ..................... 708/520

* cited by examiner

*Primary Examiner*—Chuong Dinh Ngo

(57) ABSTRACT

A finite impulse response filter (90) has a data memory bank (92, 350) for storing data vectors and a coefficient memory bank (91, 300) for storing coefficient vectors. Filtering is done by multiplying data words by coefficient words, and summing the results. The finite impulse response filter (90) operates in different modes, according to the type of data vector and coefficient vector. In two modes of operation consecutive elements of the data vector (360–369, 460–475) are stored in consecutive odd memory words (380, 382..396) within the data memory bank (92, 350). In other modes consecutive elements of the data vector are stored in consecutive memory words (380–397) in the data memory bank (92, 350). Consecutive coefficient vector elements (310–319, 410–419) are stored in the consecutive memory words (340–349) in coefficient memory bank (91, 300), wherein coefficient elements can be stored in reverse or forward order. The data memory bank (92, 350) is coupled to a data address generator (200) comprising of counter (209), two multiplexers (220, 222), a XOR gate (270) and an AND gate (290).

6 Claims, 3 Drawing Sheets

FINITE IMPULSE RESPONSE FILTER AND METHOD

FIELD OF THE INVENTION

The invention concerns an apparatus and method for a finite impulse response (FIR) filter.

BACKGROUND OF THE INVENTION

Data can be filtered by multiplying it by a series of coefficients, and summing the result. Usually, a filtering process involves many multiplication. Both data and coefficients are stored in memory banks and the filtering results in many accesses to these memory banks.

Both data and coefficients can be full complex numbers, pure real or pure imaginary numbers. Usually, filtering is done in several modes, depending on the type of data and coefficients. For example:

a. Multiplying pure real or pure imaginary coefficients by pure real or pure imaginary data.

b. Multiplying pure real or pure imaginary coefficient by complex data.

c. Multiplying alternating pure real and pure imaginary coefficients by complex data.

d. Multiplying complex coefficients by complex data.

Usually, coefficient vectors, having coefficient elements, are stored in a coefficient memory bank (CMB), and data vectors, having data elements, are stored in data memory bank (DMB). The successive elements of a data vector are usually stored in consecutive memory words within the DMB. The successive elements of a coefficient vector are usually stored in consecutive memory words within the CMB.

If data vector elements or coefficient vector elements have both real values (DR(i) denotes a real element of the data vector, CR(i) denotes a real element of the coefficient vector) and imaginary values (DI(i) denotes an imaginary element of the data vector, CI(i) denotes a imaginary element of the coefficient vector), the real value of an element is usually stored before the imaginary value of the same element.

For example, if a data vector is complex it is stored in the DMB in the following order: DR(0), DI(0), DR(1), DI(1). If the data vector is pure real it is stored in the following order: DR(0), DR(1), DR(2) . . . If the coefficient vector is complex it can be stored in two different ways. The first is: CR(0), CI(0), CR(1), CI(1) . . . . The second is: CR(N−1), CI(N−1), CR(N−2), CI(N−2). If the coefficient vector is pure real it can be stored in two different ways. The first is: CR(0), CR(1), CR(2) . . . . The second is: CR(N−1), CR(N−2), CR(N−3).

FIG. 1 is a simplified schematic diagram of address generator 107 according to the prior art. Address generator 107 includes: M-bit counter 109, having input 108 and M outputs 110–118; M multiplexers 120–128, having first set of M data inputs 130–138, second set of M data inputs 140–148, M control inputs 150–158 and M outputs 160–168; Logic XOR gate (i.e.—XOR) 170, having two inputs 172, 174 and one output 176. M+1=$\log_2 L$, wherein L is the length of DMB (i.e.—the number of memory words of the DMB).

First set of M data inputs (i.e.—first inputs) 130–138 of M multiplexers 120–128 are coupled to M outputs 110–118 of M-bit counter (i.e.—counter) 109. M−1 second data outputs 140–146 of multiplexers 120–126 are coupled to M−1 outputs 112–118 of counter 109, so that the i'th output of counter 109 (where i is an index having values of 1 to M−1) is coupled to the second data input of the (i+1)'th multiplexer.

For example, second output 112 of counter 109 is coupled to the second data input 140 of the first multiplexer 120. (M−1)'th output 118 of counter 109 is coupled to second data input 146 of the (M−1)'th multiplexer 126. Second data input 148 of the M'th multiplexer 128 is coupled to constant "0". Input 174 of XOR 170 is coupled to first output 110 of counter 109.

Input signal "Im" 180, from a control unit (not shown in FIG. 1) is sent to input 174 of XOR 170. Input signal "double" 182, sent by the control unit is inputted to M control inputs 150–158 of M multiplexers 120–128. Double 182 indicates that a data vector stored within the DMB (not shown in FIG. 1) is complex and that coefficient vector, stored in the CMB (not shown in FIG. 1) is pure real or pure imaginary, or has alternating pure real and pure imaginary elements. Im 180 indicates that a real value element is fetched from one memory data bank and a imaginary value elements is fetched simultaneously from the other memory bank. Input signal FIR 184 is sent to input 108 of counter 109. FIR 184 indicates, for example, that there is a need to generate a new address, or that there is need to read a new data word.

Output signal 185 of address generator 107 (i.e.—the address word) is provided by the signals on outputs 160–168 of M multiplexers 120–128 and the signal on output 176 of XOR 170. The least significant bit of the address word equals the signal from output 176 of XOR 170. The remaining M bits of the address word are presented by the output signals from M outputs 160–168 of M multiplexers 120–128. The (i+1)'th bit (where i has values from 1 to M) of the address word, is the output signal from the output of the i'th multiplexer. For example the second bit of the address word is the signal from output 160 of first multiplexer 120. The (M+1)'th bit of the address word equals the output signal from output 168 of M'th multiplexer 128.

The delay time of the address generator 107 equals the delay time of the M'th output bit of counter 109 (i.e.—the time for the M'th output 118 of counter 109 to change as result of an input signal at input 108 of counter 109) plus the delay time of a multiplexer (one out of 120–128).

A significant disadvantage of this and other prior art arrangements is the complicated address generator, needed to support the accesses to data vector stored in DMB. The complexity of the address generator is a result of the different ways in which data and coefficient are stored within the DMB and the CMB. Another disadvantage of the prior art is a large delay time, caused by the complex address generator. The large delay time limits the working frequency of the FIR filter.

For the above mentioned reasons and for other reasons, there continues to be a need for an improved FIR filter and method.

DETAILED DESCRIPTION OF THE DRAWINGS

The present invention provides an improved finite impulse response (i.e.—FIR) filter and method having an efficient and relatively fast address generator, using less hardware, for more effectively reading and writing data words stored in a FIR filter data memory bank.

Figure 1:
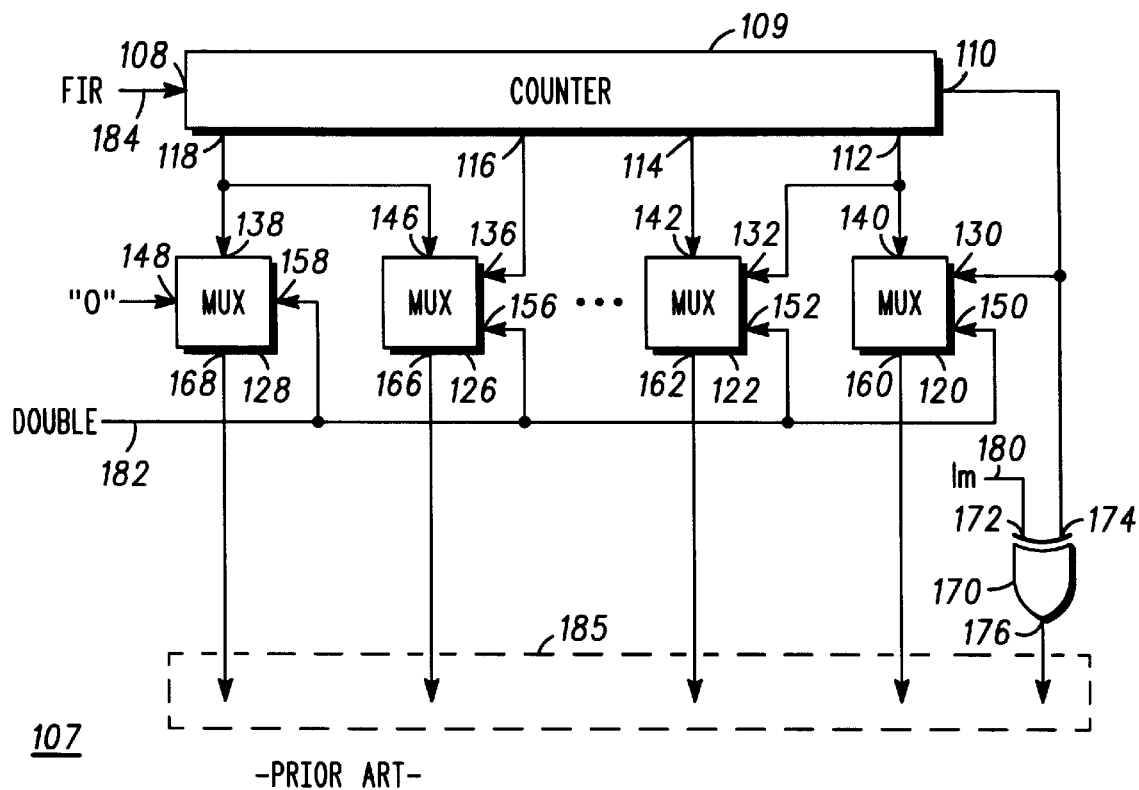
FIG. 1 is a schematic diagram of an address generator according to the prior art.
Figure 2:
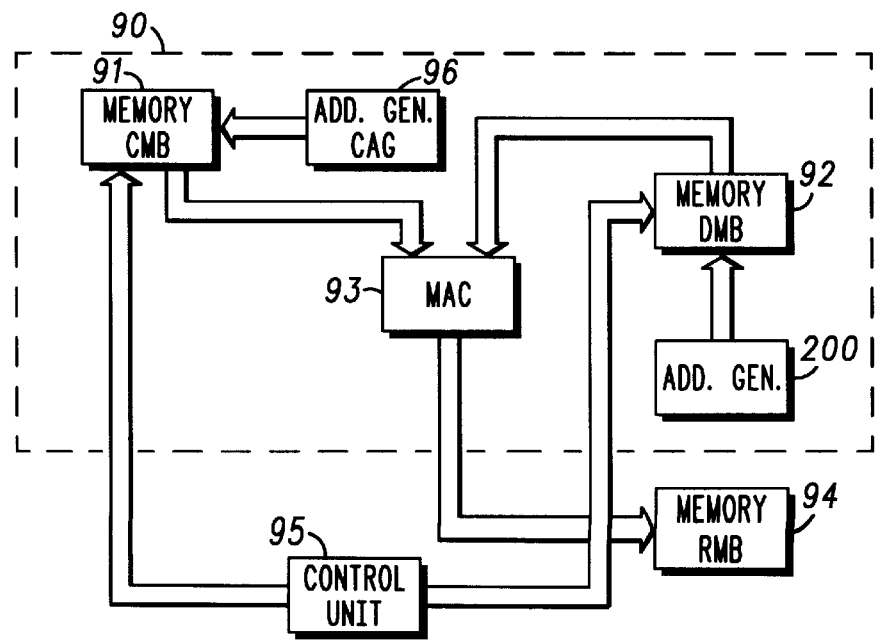
FIG. 2 is a schematic diagram of an finite impulse response filter according to a preferred embodiment of the invention.

FIG. 2 is a simplified schematic diagram of a FIR filter 90 according to a preferred embodiment of the invention. Finite response impulse filter 90 has CMB 91, DMB 92, data address generator (i.e.—address generator) 200, coefficient address generator 96 and multiply and accumulate unit (i.e.—MAC) 93. FIR filter is coupled to result memory bank (i.e.—RMB) 94 and to control unit 95. CMB 91 is coupled to control unit 95, to coefficient memory bank 97 and to MAC 93. DMB 92 is coupled to control unit 95, to address generator 200 and to MAC 93. MAC 93 is coupled to DMB 92, CMB 91 and to RMB 94. Control unit 95 writes to CMB 91 coefficient vectors, and writes data vectors to DMB 92. The data vectors, stored within DMB 92 are multiplied by coefficient vectors stored within CMB 91. Each of the data vector elements is read from DMB 92, according to an address sent to DMB 92 by address generator 200, to MAC 93. Each of the coefficient vector elements is read from CMB 91, according to an address sent to CMB 91 by coefficient address generator 96 and sent to MAC 93. MAC 93 multiplies all the data and coefficient elements, accumulates the result and stores it in RMB 94.

Figure 3:
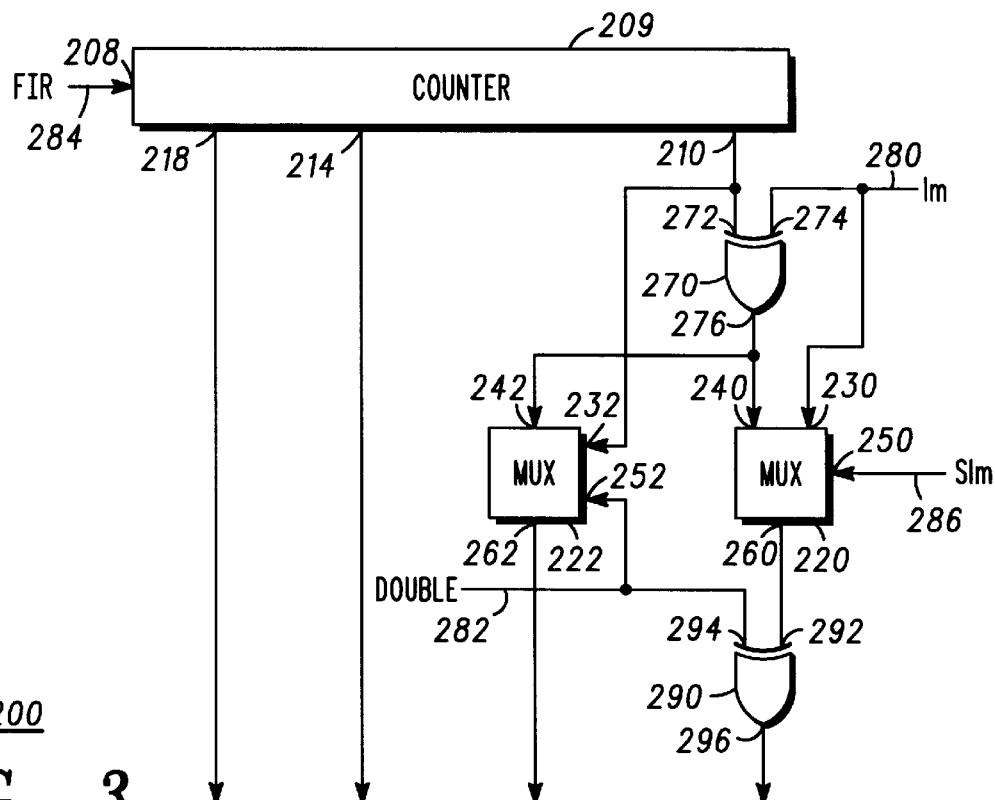
FIG. 3 is a schematic diagram of an address generator according to a preferred embodiment of the invention.

FIG. 3 is a schematic diagram of a address generator 200 according to a preferred embodiment of the invention. The same reference numbers are used to identify like elements in the figures. Address generator 200 is comprised of: M-bit counter 209, having input 208 and M outputs 210–218. Two multiplexers 220–222, having first data inputs 230–232, second data inputs 240–242, two control inputs 250–252 and two outputs 260–262. Logic XOR gate (i.e.—XOR) 270, having two input 272, 274 and one output 276. Logic AND gate (i.e.—AND) 290 having two inputs 292, 294 and output 296. $M=\log_2 L$, wherein L is the length of DMB (i.e.—the number of memory words of DMB). First output 210 of counter 209 is coupled to input 272 of XOR 270 and to first data input 232 of second multiplexer 222. Output 276 of XOR 270 is coupled to second data input 240 of first multiplexer 220 and to second data input 242 of second multiplexer 222. Output 260 of first multiplexer 220 is coupled to input 292 of AND 290.

Input signal Im 280, sent by a control unit 95 (shown in FIG. 2) is inputted to input 274 of XOR 270 and to input 230 of first multiplexer 220. Im 280 indicates that a real value element is fetched from one memory data bank and a imaginary value elements is fetched simultaneously from the other memory bank. Input signal double 282, sent by a control unit 95 is inputted to control input 252 of second multiplexer 222 and to input 294 of AND 290. Double 282 indicates that a data vector stored within DMB 92 is complex and that coefficient vector, stored in the CMB 91 is pure real or pure imaginary, or has alternating pure real and pure imaginary elements. Input signal Slm 286, sent by control unit 95 is inputted to control input 250 of first multiplexer 220. Slm 286 indicates that a pure real coefficient is multiplied by complex data. Input signal FIR 284, sent by control unit 95 is inputted to input 208 of counter 209. Input signal FIR 84 indicates, for example, that there is a need to generate a new address, or that there is need to read a new data word.

The output signal of the address generator 200 (i.e.—the address word) is provided by the signals on output 262 of second multiplexer 222, output 296 of AND 290 and on M−1 output 212–218 of counter 209. The least significant bit of the address word is provided by the signal on output 296 of AND 290. The next bit of the address word is provided by the signal on output 262 of the second multiplexer 222. The remaining M−1 bits of the address word are provided by the signals that are on the M−1 most significant outputs 212–218 of counter 209. The (i+1)'th bit (i having values from 1 to M) of the address word, is the output signal from the (i)'th output of counter 209. For example, the third bit of the address word is the signal from the second output 212 of counter 209. The (M+1)'th bit of the address word is the output signal outputted from output 218 of counter 229.

The delay time of address generator 200 equals the highest delay time out of the two following delay times:

a. The delay time of the M'th output bit of counter 209.

b. The sum of the delay time of the first output bit of counter 209, plus the delay time of XOR 270, plus the delay time of multiplexer 220, plus the delay time of AND 290.

The delay time of the first bit of counter 209 equals the time that it takes for the first output 210 of counter 209 to change as result of an input signal at input 208 of counter 209. The delay time of XOR 270 equals the time it takes to XOR 270 output 276 to change as a result of an input signal at input 272 or 274. The delay time of multiplexer 220 equals the larger of two delay times; i.e., the time it takes output 260 of multiplexer 220 to change as a result of a control signal at input 250; the time it takes output 260 of multiplexer 220 to change as a result of a data signal at input 230 or 240.

Usually, the delay time of the M'th output bit of counter 209 is larger than the other delay time, so that the delay time of new address generator 200 is smaller than the delay time of prior art address generator 107.

Address generator 200 needs less hardware components then prior art address generator 107. For example, if M=12 then address generator 107 has a 12-bit counter, 12 multiplexers, and one XOR. Address generator 200 has a 12-bit counter, two multiplexers, one XOR and one AND. In this example, address generator 200 has an additional AND gate but address generator 107 has an additional ten multiplexers.

Figure 4:
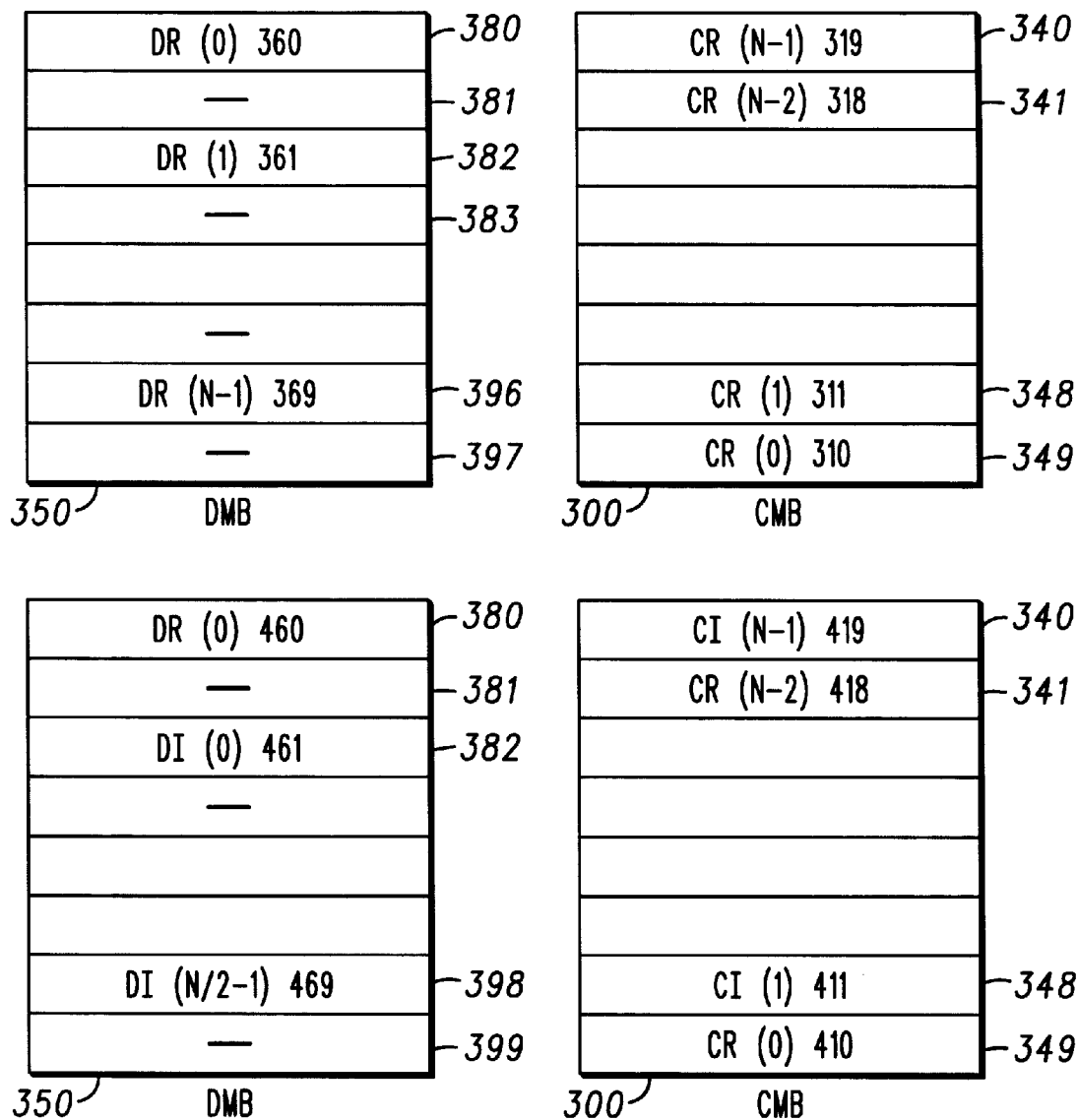
FIG. 4 is a schematic diagram of a data memory bank (DMB) and of a coefficient memory bank (CMB), according to a preferred embodiment of the invention.

Address generator 200 is designed to support the storage of data and coefficient vectors in their memory banks, as shown in FIG. 4.

FIG. 4 is a schematic diagram of data memory bank (DMB) 350, having 2N memory words 380–399 and of coefficient memory bank (CMB) 300, having N memory words 340–349, according to a preferred embodiment of the invention. DMB 350 is analogues to DMB 92 of FIG. 2. CMB 300 is analogues to CMB 91 of FIG. 2.

When a pure real coefficient vector C having N elements 310–319 (denoted as CR(O) . . . CR(N−1)), is multiplied by a pure real data vector D having N elements 360–369 (denoted as DR(0) . . . DR(N−1)), then the coefficient vector and the data vector are preferably stored in the following way:

a. N consecutive elements 310–319 CR(i) of coefficient vector C are stored in N consecutive memory words 340–349 of CMB 300, in opposite order, so that DR(0) is stored at the Nth memory word 349 of CMB 300, and DR(N−1) is stored in the first memory word 340 of CMB 300.

b. N consecutive elements 360–369 DR(i) of data vector D are stored in N consecutive odd memory words 380,382,384 ... 396 of DMB 350, so that DR(0) is stored in the first memory word 380 of DMB 350, DR(1) is stored in the third memory word 382 of DMB 350, and so forth.

When an alternating real and imaginary coefficient vector C, having N elements 410–419 (denoted as CR(0), CI(1), CR(2) ... CI(N−1)), is multiplied by a complex data vector D, having N elements D(i) 460–479, each element D(i) has a real part DI(i) and a imaginary part (DR(0), DI(0), ... DR(N−1), DI(N−1), then the coefficient vector C and the data vector D(i) are stored in the following way:

a. N consecutive elements 410–419 of coefficient vector C are stored in N consecutive memory words 340–349 of CMB 300, in opposite order, so that CR(0) 410 is stored in the N'th memory word 349 of CMB 300, and CI(N−1) 419 is stored in the first memory word 340 of CMB 300.

b. N/2 consecutive elements 460–465 of data vector D are stored in N consecutive odd memory words 380,382, 384 ... 396 of DMB 350, so that DR(0) 460 is stored in the first memory word 380 of DMB 350, DI(0) 460 is stored in the third memory word 382 of DMB 350, and so forth. In other cases, consecutive elements are stored in consecutive memory words of DMB 350 or CMB 300, as in prior art methods.

Figure 5:
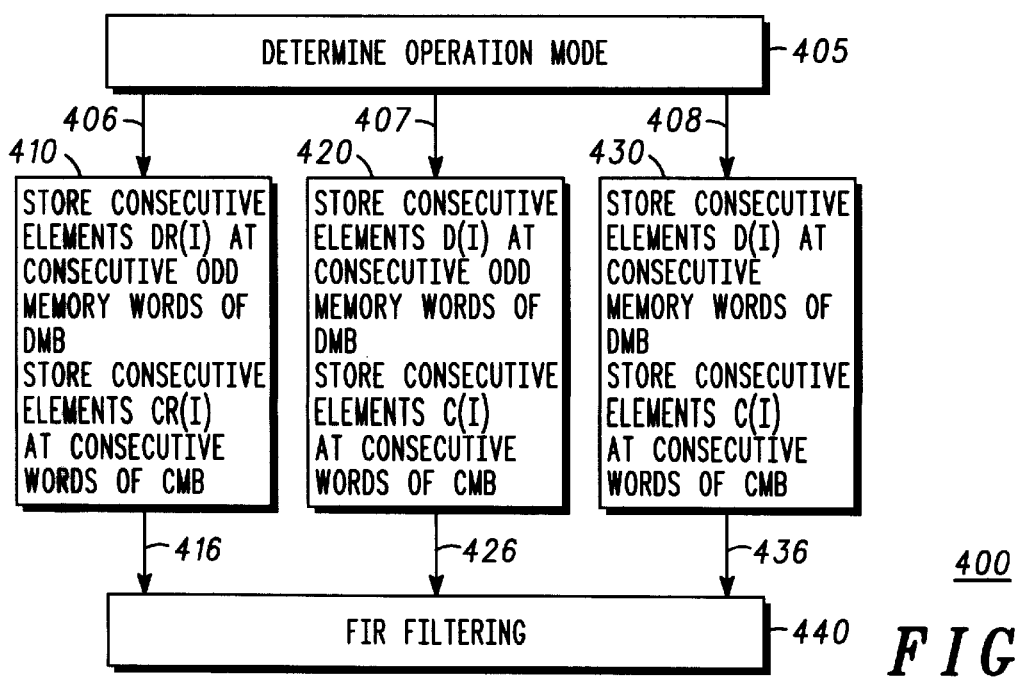
FIG. 5 is a flow diagram of a method according to a preferred embodiment of the present invention.

FIG. 5 is a flow diagram of a method 400 according to a preferred embodiment of the present invention. In 'DETERMINE OPERATION MODE' step 405, control unit 95 determines what is the mode of operation, according to the type of data vector and coefficient vector. Control unit 95 sends to FIR filter 90 the input signals Im, Slm, and double, accordingly. As indicated by paths 406, 407 and 408, step 405 is conveniently coupled to steps 410, 420 and 430.

As indicated by step 406, if data vector D and coefficient vector C are pure real, then during step 410 consecutive elements of data vector DR(i) are stored in consecutive odd memory words of DMB 350, and consecutive elements of coefficient vector CR(i) are stored in consecutive words of CMB 300. As indicated by step 407, if coefficient vector C has alternating pure real and pure imaginary elements, and data vector D is complex then, during step 420, consecutive elements of data vector D are stored in consecutive odd memory words of DMB 350, and consecutive elements of coefficient vector C are stored in consecutive words of CMB 300.

Else, as indicated by path 408, during step 430, data vector D elements are stored in consecutive memory words of DMB 350 and coefficient vector C elements are stored in consecutive memory words of CMB 350.

As indicated by paths 416, 426 and 436, steps 410, 420 and 430 are conveniently coupled to step 440.

In 'FIR FILTERING' step 440, data vector D is multiplied by coefficient vector C in the following way:
A data word is read from DMB 350 and a coefficient word is read from CMB 300. The data word and coefficient word are sent to MAC 93 where the data word is multiplied by the coefficient word. A consecutive coefficient word is read from CMB 300 and sent to MAC 93 and a consecutive data word is read from DMB 350 and sent to MAC 93. Coefficient words are multiplied by data words and the results of these multiplications are summed by MAC 93. This process produces a result vector R, wherein each element of the result vector R is the sum of all the multiplications of a single data word by all the coefficients.

What is claimed is:

1. A finite response impulse filter comprising:
   data memory bank, for storing a data vector;
   a coefficient memory bank, for storing a coefficients vector;
   a data address generator, coupled to the data memory bank, for generating memory addresses, resulting in reading or writing data stored within data memory bank;
   wherein the finite response impulse filter is coupled to a control unit; wherein the control unit controls reading and writing from the data memory bank and the coefficient memory bank, in a plurality of modes;
   wherein in a first mode of operation, the data vector and the coefficient vector are pure real;
   wherein in a second mode of operation, the coefficient vector has alternating real and imaginary elements, and the data vector has complex elements;
   wherein all the other possible combinations of data vector and coefficient vector are dealt in a third mode;
   wherein in all modes of operation, a real part of an element of the data vector is stored before an imaginary part of the element of the data vector;
   wherein in all modes of operation, a real part of an element of the coefficient vector is stored before an imaginary part of the element of the coefficient vector;
   wherein in the first and second mode of operation, consecutive elements of the data vector are stored in consecutive odd memory words within data memory bank, and consecutive elements of the coefficients vector are stored in consecutive memory words within coefficient memory bank, in opposite order; and
   wherein in the third mode of operation, consecutive elements of the data vector are stored in consecutive memory words within data memory bank, and consecutive elements of the coefficient vector are stored in consecutive memory words within coefficient memory bank.

2. A finite response impulse filter of claim 1 wherein the length of the data memory bank is double then the length of coefficient memory bank.

3. A finite response impulse filter of claim 1, wherein the data address generator is comprising of:
   a counter, coupled to the control unit and to the data memory;
   a XOR gate, coupled to a least significant bit output of the counter and to the control unit;
   a first multiplexer, coupled to the output of the XOR gate and to the control unit;
   a second multiplexer, coupled to the XOR gate, to the control unit and to a second least significant output bit of the counter;
   an AND gate, coupled to the control unit and to the output of the first multiplexer; and
   wherein the address word signal, sent to the data memory bank is provided by the signals on the output of the AND gate, the second multiplexer and the outputs of the counter, which are not coupled to the second multiplexer or the XOR gate.

4. A finite response impulse filter of claim 3, wherein the control unit sends the finite response impulse filter the following signals:
   a first signal, which indicates that a real value element is fetched from a memory bank and a imaginary value elements is fetched simultaneously from the other memory bank;
   a second signal which indicates that the coefficient vector is comprised of pure real value elements and data vector is comprised of complex elements;

a third signal which indicates that data vector stored within data memory bank is complex and that coefficient vector, stored in coefficient memory bank is pure real or pure imaginary or has alternating pure real and pure imaginary elements; and a fourth signal which indicates that a data word has to be read.

5. A finite impulse response filter of claim 4, wherein the first signal is inputted to an input of the XOR gate and to a data input of the first multiplexer;

wherein the second signal is inputted to the control input of the first multiplexer;

wherein the third signal is inputted to the control input of the second multiplexer and to an input of the AND gate; and wherein the fourth signal is inputted to the input of the counter.

6. A method for finite response impulse filtering, comprising the following steps:

determining what is the mode of operation, according to the type of data vector and coefficient vector;

sending signals indicating the mode of operation;

storing consecutive elements of data vector in consecutive odd memory words of the data memory bank, and storing consecutive elements of coefficient vector in consecutive words of coefficient memory bank if the data vector and coefficient vector are pure real;

storing consecutive elements of data vector in consecutive odd memory words of the data memory bank, and storing consecutive elements of coefficient vector in consecutive words of coefficient memory bank if coefficient vector has alternating pure real and pure imaginary elements, and data vector is complex;

else, storing consecutive data vector elements in consecutive memory words of data memory bank and storing consecutive coefficient vector in consecutive memory words of coefficient memory bank; and reading data vector elements and coefficient vector elements;

multiplying data vector elements by coefficient vector elements and summing the results of the multiplications.

* * * * *